United States Patent
Kim et al.

(10) Patent No.: US 7,550,917 B2
(45) Date of Patent: Jun. 23, 2009

(54) ORGANIC LIGHT EMITTING DIODE

(75) Inventors: Mu-Gyeom Kim, Hwaseong-si (KR); Sang-Hoon Park, Seongnam-si (KR); Joon-Yong Park, Yongin-si (KR); Sang-Yeol Kim, Gwacheon-si (KR); Tae-Woo Lee, Seoul (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 365 days.

(21) Appl. No.: 11/499,653

(22) Filed: Aug. 7, 2006

(65) Prior Publication Data

US 2007/0194697 A1    Aug. 23, 2007

(30) Foreign Application Priority Data

Feb. 17, 2006    (KR) .............. 10-2006-0015624

(51) Int. Cl.
*H05B 33/00*    (2006.01)
(52) U.S. Cl. .................. 313/504; 313/505; 313/506
(58) Field of Classification Search .............. None
See application file for complete search history.

(56) References Cited

U.S. PATENT DOCUMENTS

| | | | |
|---|---|---|---|
| 6,570,323 B1 * | 5/2003 | Nakamata et al. | 313/500 |
| 6,906,456 B2 * | 6/2005 | Sakaguchi | 313/504 |
| 7,338,720 B2 * | 3/2008 | Satsuki et al. | 428/690 |
| 2001/0011867 A1 * | 8/2001 | Nagayama et al. | 313/500 |
| 2004/0256982 A1 * | 12/2004 | Nagayama et al. | 313/505 |
| 2005/0104508 A1 * | 5/2005 | Ozawa et al. | 313/500 |
| 2006/0006792 A1 * | 1/2006 | Strip | 313/500 |
| 2007/0216289 A1 * | 9/2007 | Kuma et al. | 313/504 |

* cited by examiner

*Primary Examiner*—Ashok Patel
(74) *Attorney, Agent, or Firm*—Robert E. Bushnell, Esq.

(57) ABSTRACT

An organic light emitting diode that uses edge light emission and has a long lifespan. An anode and a cathode are spaced by a pattern distance and they are located at the upper and lower portions of the light emitting part respectively. The organic light emitting diode uses a separate light emission area of the light emitting part for each of the initial and the final usage stages so that a tail drop of the luminance is prevented and the lifespan of the diode is increased.

11 Claims, 10 Drawing Sheets

ORGANIC LIGHT EMITTING DIODE

CLAIM OF PRIORITY

This application makes reference to, incorporates the same herein, and claims all benefits accruing under 35 U.S.C.§119 from an application for AN ORGANIC LIGHT EMITTING DIODE earlier filed in the Korean Intellectual Property Office on 17 Feb. 2006 and there duly assigned Serial No. 10-2006-0015624.

BACKGROUND OF THE INVENTION

1. Field of the Invention

The present invention relates to an organic light emitting diode, and more particularly, to an organic light emitting diode using edge emission and having long lifespan.

2. Description of the Related Art

Generally, organic light emitting displays include an organic light emitting diode (OLED) laminated on a thin film transistor (TFT) in order to form an electronic circuit so that light is emitted in response to a signal controlled by the TFT. The organic light emitting diode includes a light emitting part laminated between an anode and a cathode. When a current flows through the organic light emitting diode, the light emitting part is excited by combining holes with electrons (i.e., electric coupling), so that energy is emitted in the form of light. The light emitting part includes a hole injecting layer (HIL), a hole transporting layer (HTL), and a light emitting layer (EML).

Light is not uniformly generated throughout the light emitting layer. Specifically, the light emitting area is concentrated at the interface between the hole transporting layer and the light emitting layer. When the laminated light emitting part includes a hole injecting layer, a hole transporting layer, and a light emitting layer sandwiched between a cathode and the anode, light emission is concentrated essentially only at the interface between the hole transporting layer and the light emitting layer since electrons migrating from the cathode are concentrated at this area.

In the meantime, when the organic light emitting diode is used extensively, the material property of the light emitting part changes, which leads to an increase of the electrical resistance thereof. Thus, when an insufficient current flows through the light emitting part because of such an increase in resistance, light emission decreases. Therefore, the luminance of the organic light emitting diode is reduced.

This deterioration in light emission over time occurs especially when the light emitting layer is made out of a polymeric material. Specifically, to form such a light emitting layer, a polymeric material is first dissolved in a solvent, and thereafter the layer is formed using a coating method such as spin coating. When the light emitting layer deteriorates over time, the property of the dissolved polymeric material is changed and the polymeric material no longer remains dissolved and produces an insoluble layer. Thus, the material property of the light emitting layer becomes identical to that of the insoluble layer, and the resistance of light emitting layer is increased, leading to decreased light emission.

The luminance of the organic light emitting diode rapidly decreases with time and drops to below 50% of the initial value after approximately 110 hours of use. This reduction in the luminance is referred to as "a tail drop", and is caused by the increase of the resistance of the polymeric material of the light emitting layer, as described above.

When a voltage is applied to the organic light emitting diode in the case where the luminance drops below 50% of its original value, the center of the light emitting layer becomes dark and the edge thereof becomes relatively bright. This phenomenon is called "edge light emission" and it is caused because the current flowing through the light emitting layer avoids the insoluble area at the center where the resistance has increased. That is, when the light emitting layer becomes insoluble, the resistance thereof increases, and current does not flow through the light emitting layer and thus light emission is not generated. Normally, when the resistance of the light emitting layer is low and before it rises, the current flows through the light emitting layer along the shortest possible path so that the light emission is generated at the center of the organic light emitting diode. However, after the organic light emitting is extensively used, the resistance of the light emitting layer rapidly increases at the center thereof so that the current flows at the edges of the light emitting layer where the resistance is relatively low. Thus, although light emission is generated at the edge of the of the light emitting layer upon tail drop, the luminance at the center of organic light emitting the diode is below 50% of its original value, so that at this point in time, it is considered that the lifespan of the organic light emitting diode as a display element has ended. Therefore, what is needed is an organic light emitting diode with increased lifespan by increasing the area in the light emitting layer that can emit light during later stages in the life of the OLED.

SUMMARY OF THE INVENTION

It is therefore an object of the present invention to provide an improved OLED.

It is also an object of the present invention to provide an OLED having a longer lifespan.

It is further an object of the present invention to provide an OLED that does not have a tail drop in luminance efficiency with time.

It is still an object of the present invention to provide an organic light emitting diode having increased lifespan by defining separate light emission areas that are used later in a lifespan of the device.

These and other objects can be achieved by an organic light emitting diode that includes an anode, a light emitting part arranged on the anode and a cathode arranged on the light emitting part, wherein at least one of the anode and the cathode is arranged as a striped pattern comprising a plurality of stripes, each stripe separated from an adjoining stripe by a pattern distance, the organic light emitting diode being of a laminated structure. The pattern distance can be equal to a width of a stripe arranged at a center of the striped pattern. The pattern distance can be in the range of 10 μm to 1000 μm. Both the anode and the cathode can be arranged in a striped pattern, the stripes can be separated from each other by the pattern distance, each stripe of the anode can partially overlap a corresponding stripe of the cathode. The light emitting part can include a hole injecting layer arranged on the anode, a hole transporting layer arranged on the hole injecting layer and a light emitting layer arranged on the hole transporting layer. The light emitting layer can include a polymeric material. The light emitting layer can include a polymeric material dissolved in a solvent, the polymeric material can coalesce and precipitate out of the solvent upon application of a current thereto for an extended period of time.

According to another embodiment of the present invention, there is provided an organic light emitting diode that includes an anode, a light emitting part arranged on the anode, the light emitting part comprising a polymeric material, and a cathode arranged on the light emitting part, wherein at least one of the anode and the cathode are adapted to have a shape that produces enhanced luminance upon being in a final usage stage of the organic light emitting diode, the organic light emitting diode being of a laminated structure. The light emitting part can include a light emitting layer that includes, upon initial usage stage, a polymeric material dissolved in a solvent, wherein the polymeric material coalesces and precipitates out of the solvent upon the final usage stage after being subjected to current for an extensive period of time. The enhanced luminance upon the final usage stage can be achieved by having a light emission area in the light emitting part during the final usage stage being equal to the light emission area during an initial usage stage. The light emission area of the light emitting part during the initial usage stage can be unusable for light emission during the final usage stage due to a precipitation of the polymeric material out of a solvent.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
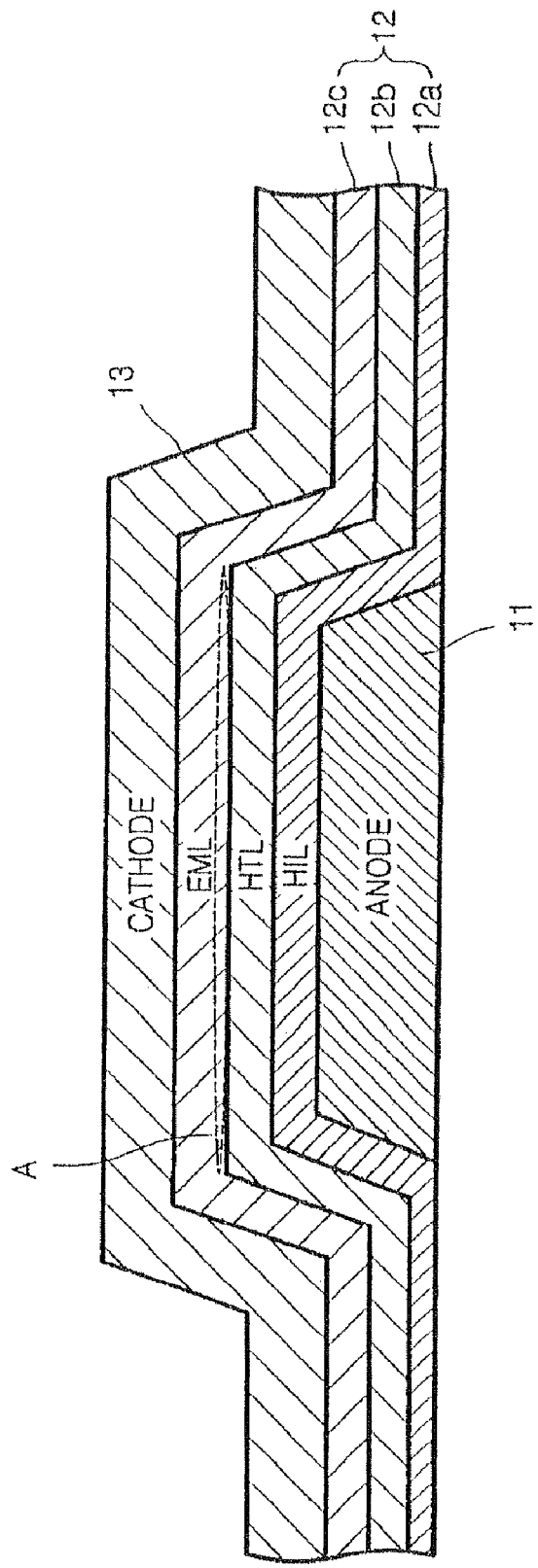
FIG. 1 is a cross sectional view of an organic light emitting diode according to the related art.

Turning now to the figures, FIG. 1 is a view of an organic light emitting diode. As illustrated in FIG. 1, the light emitting area is indicated by the dotted line and is concentrated at the interface between the hole transporting layer $12b$ and the light emitting layer $12c$. As shown in FIG. 1, when the laminated light emitting part 12 includes a hole injecting layer $12a$, a hole transporting layer $12b$, and a light emitting layer $12c$ sandwiched between a cathode 13 and the anode 11, light emission is concentrated essentially only at the interface (area A in FIG. 1) between the hole transporting layer $12b$ and the light emitting layer $12c$, since electrons migrating from the cathode 13 are concentrated at area A.

When the organic light emitting diode is used extensively, the material property of the light emitting part 12 changes, which leads to an increase in the electrical resistance thereof. Thus, when insufficient current flows through the light emitting part 12 because of the increase in resistance, light emission decreases. As a result, the luminance of the organic light emitting diode is reduced.

This deterioration in light emission over time occurs especially when the light emitting layer $12c$ is made out of a polymeric material. Specifically, to form such a light emitting layer $12c$, a polymeric material is first dissolved in a solvent, and thereafter the layer is formed using a coating method such as spin coating. When the light emitting layer $12c$ deteriorates over time, the property of the dissolved polymeric material changes and the polymeric material coalesces and precipitates out of the solvent and is thus no longer dissolved. As a result, the material property of the light emitting layer $12c$ becomes identical to the material property of the polymeric material precipitate, and the resistance of light emitting layer $12c$ increases, thus decreasing light emission.

Figure 2:
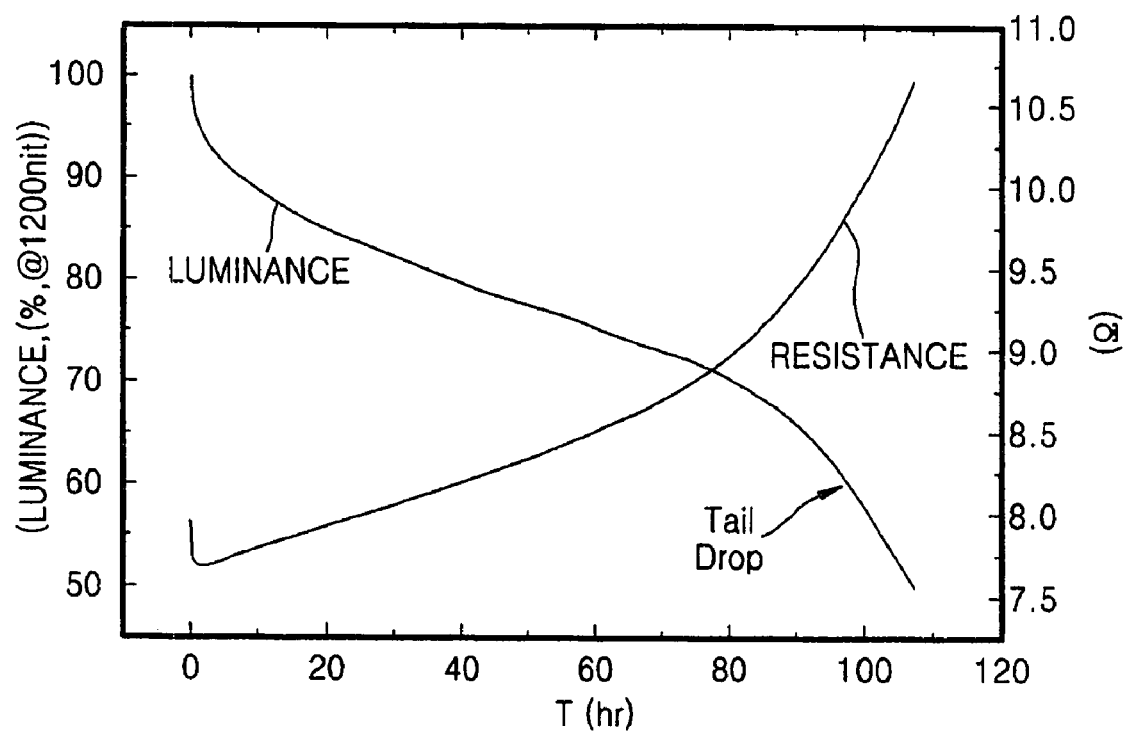
FIG. 2 is a graph of each of luminance and resistance versus time for the organic light emitting diode of FIG. 1.

Turning now to FIG. 2, FIG. 2 is a graph of each of luminance and resistance versus age of the organic light emitting diode of FIG. 1 having the light emitting layer $12c$ made out of a polymeric material. According to the graph, the luminance rapidly decreases with time and drops below 50% of the initial value after approximately 110 hours of use. This reduction in luminance is referred to as "a tail drop" and is caused by the increase of the resistance of the polymeric material of the light emitting layer $12c$ as described above.

Figure 3A:
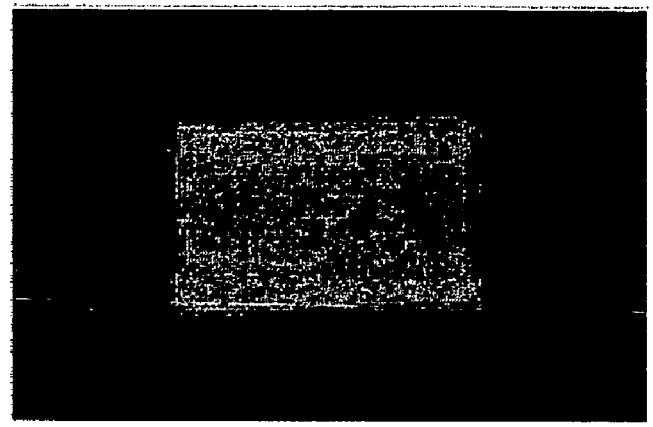
FIGS. 3A and 3B are photographs showing the organic light emitting diode of FIG. 1 during an initial usage stage and during a final usage stage, respectively.
Figure 3B:
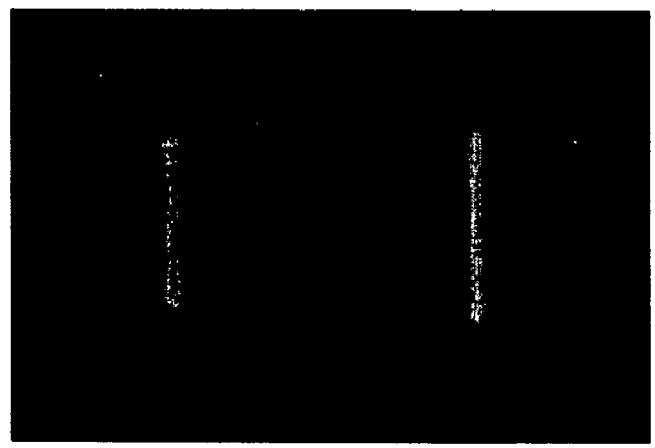

When a voltage is applied to the organic light emitting diode at a time when the luminance has dropped below 50% of the original value, the center of the light emitting layer $12c$ becomes dark and the edges thereof becomes relatively bright. This phenomenon is called edge light emission and occurs because the current flowing through the light emitting layer $12c$ avoids the insoluble area (area A in FIG. 1) where the resistance has increased. In other words, when the light emitting layer $12c$ becomes insoluble and coalesces and precipitates out of the solvent, the resistance thereof increases, the current no longer flows through a center of the light emitting layer $12c$ and light emission is no longer generated at the center. Normally, when the resistance of the light emitting layer $12c$ has not increased with use, the current flows through the light emitting layer 12 along the shortest distance and light emission is generated at the center of the organic light emitting diode (see FIG. 3A). However, after the organic light emitting diode is extensively used, the resistance of the light emitting layer $12c$ rapidly increases at the center thereof so that the current flows at the edges of the light emitting layer $12c$ where the resistance is relatively low. Thus, although light emission is generated at the edges of the of the light emitting layer $12c$ (see FIG. 3B) upon tail drop, the luminance at the center of organic light emitting the diode is below 50% of its original value, so that at this point, it is considered that the lifespan of the organic light emitting diode as a display element has ended.

Figure 4:
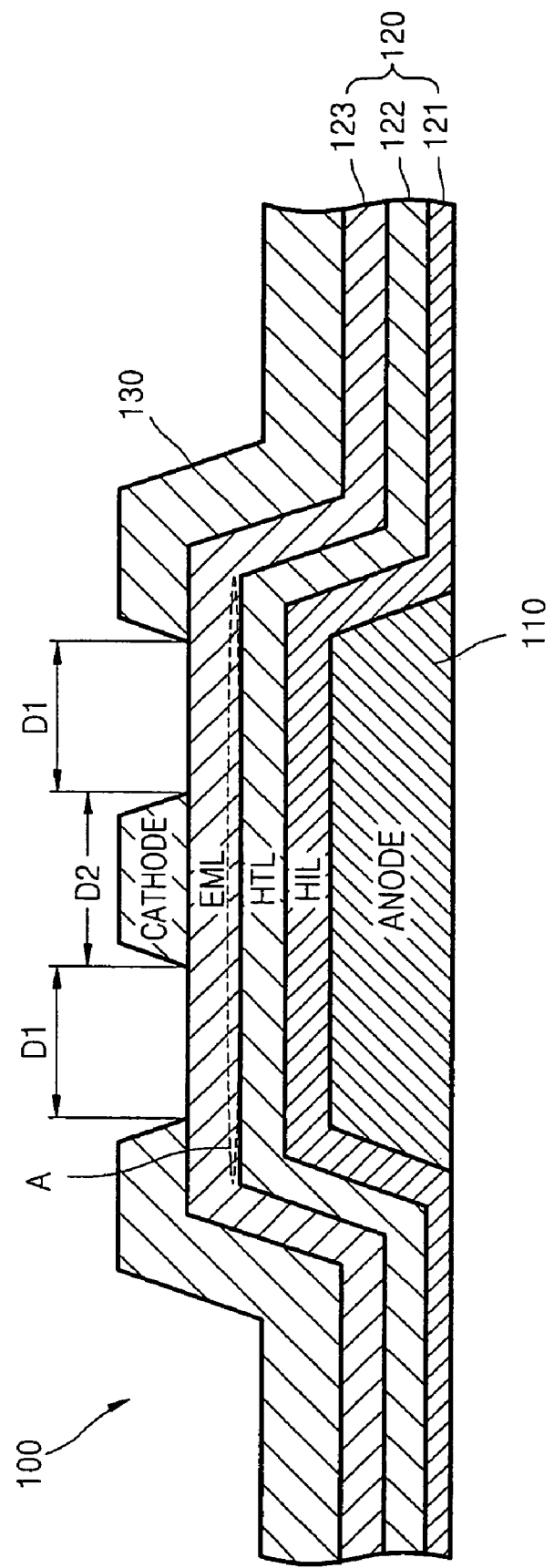
FIG. 4 is a cross sectional view of an organic light emitting diode according to a first embodiment of the present invention.

Turning now to FIG. 4, FIG. 4 is a cross sectional view of an organic light emitting diode 100 according to a first embodiment of the present invention. As shown in FIG. 4, the organic light emitting diode 100 has a laminated structure including an anode 110, a light emitting part 120, and a cathode 130, which are arranged sequentially. The light emitting part 120 includes a hole injecting layer 121, a hole transporting layer 122, and a light emitting layer 123.

Figure 5A:
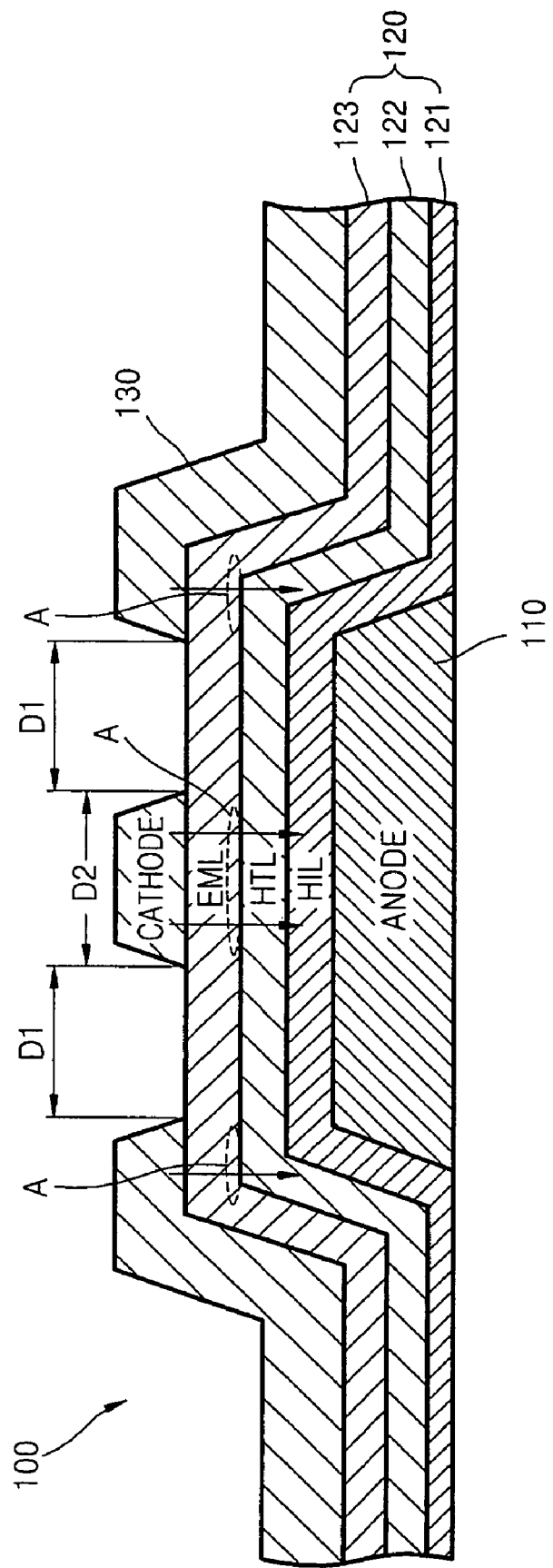
FIGS. 5A and 5B are cross sectional views showing electric coupling for the organic light emitting diode of FIG. 4 during an initial usage stage and during a final usage stage, respectively.

The cathode 130 does not entirely cover the light emitting part 120, and is formed in a striped pattern with a prong separation distance (pattern distance) D1 between each stripe or prong. According to an aspect of the present invention, the lifespan of the organic light emitting diode 100 is increased over that of FIG. 1 by exploiting edge light emission during the final usage stage. That is, during the initial usage stage, electric coupling is generated by electrons flowing along the straight arrows indicated in FIG. 5A between the cathode 130 and the anode 110. It is to be understood that a current flows in reverse to that of the electron's moving direction.

Figure 5B:
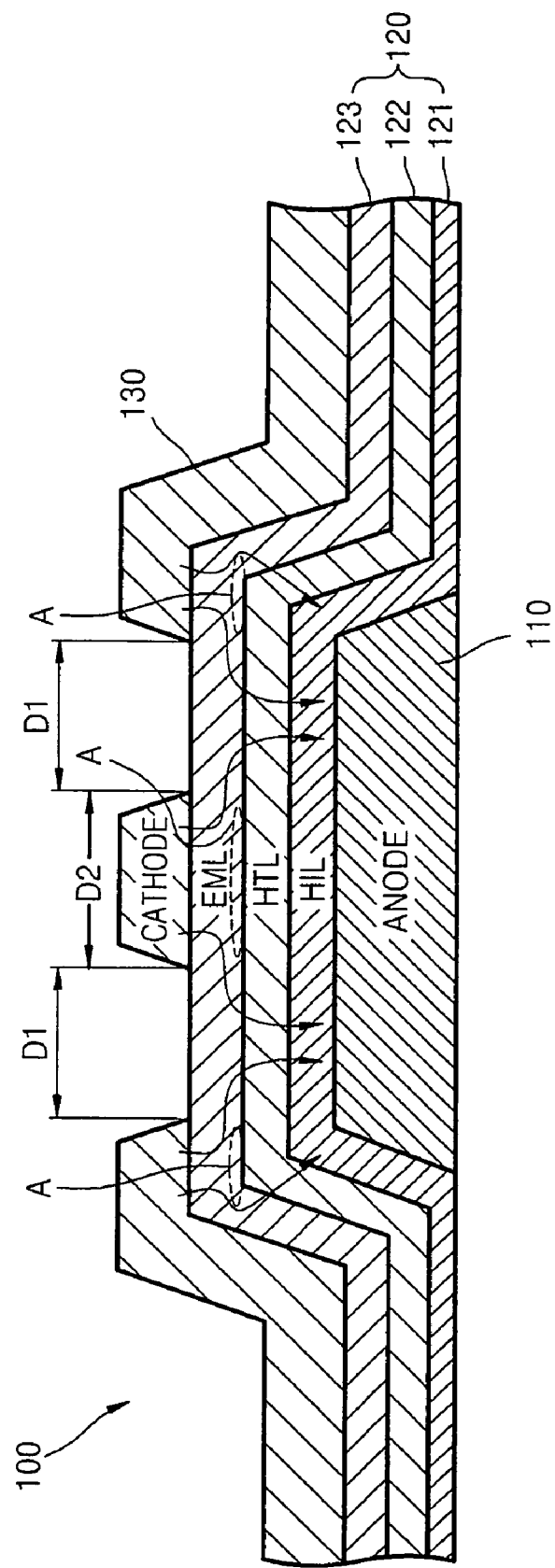

When the organic light emitting diode 100 is used for a long time, a deteriorated region, such as a precipitate area, is formed at a center of the light emitting layer 123 of the light emitting part 120 (corresponding to area A of FIG. 5A) and the resistance increases in this central area so that the electric coupling is poor and light emission is not generated as desired in the center. As a result, the electrons flow along a curved path of FIG. 5B to avoid the deteriorated region (area A). In the final stages as depicted by the arrows of FIG. 5B, the electric coupling is achieved in a region having a low resistance, and the electrons flow along the curved path of FIG. 5B to avoid the deteriorated region (area A). Accordingly, light emission is generated along the curved paths of FIG. 5B in the final usage stages of the OLED 100 and not along the straight line path of FIG. 5A. In other words, the light emission regions used in the initial usage stage and in the final usage stage are different from each other and two light emission regions are used successively according to the passage of time.

While the organic light emitting diode of FIG. 1 cannot maintain adequate light luminance during the final usage stage because the electrons flow along a curved path in the structure of are restricted to the very thin edge (refer to FIG. 3B), in the first embodiment of FIG. 4, the light emission area for the final usage stage is much larger because the cathode 130 is formed in a striped pattern so that cathode 130 has more edges to provide for more emission area during the final usage stage. Therefore, when the prong separation distance D1 is equal to the width D2 of each prong of the laminated layer located at a center of the stripe pattern, the light emission area does not change, resulting in no rapid change of luminance. It is preferable that the prong separation distance D1 is in the range of 10 μm to 1000 μm.

Figure 6:
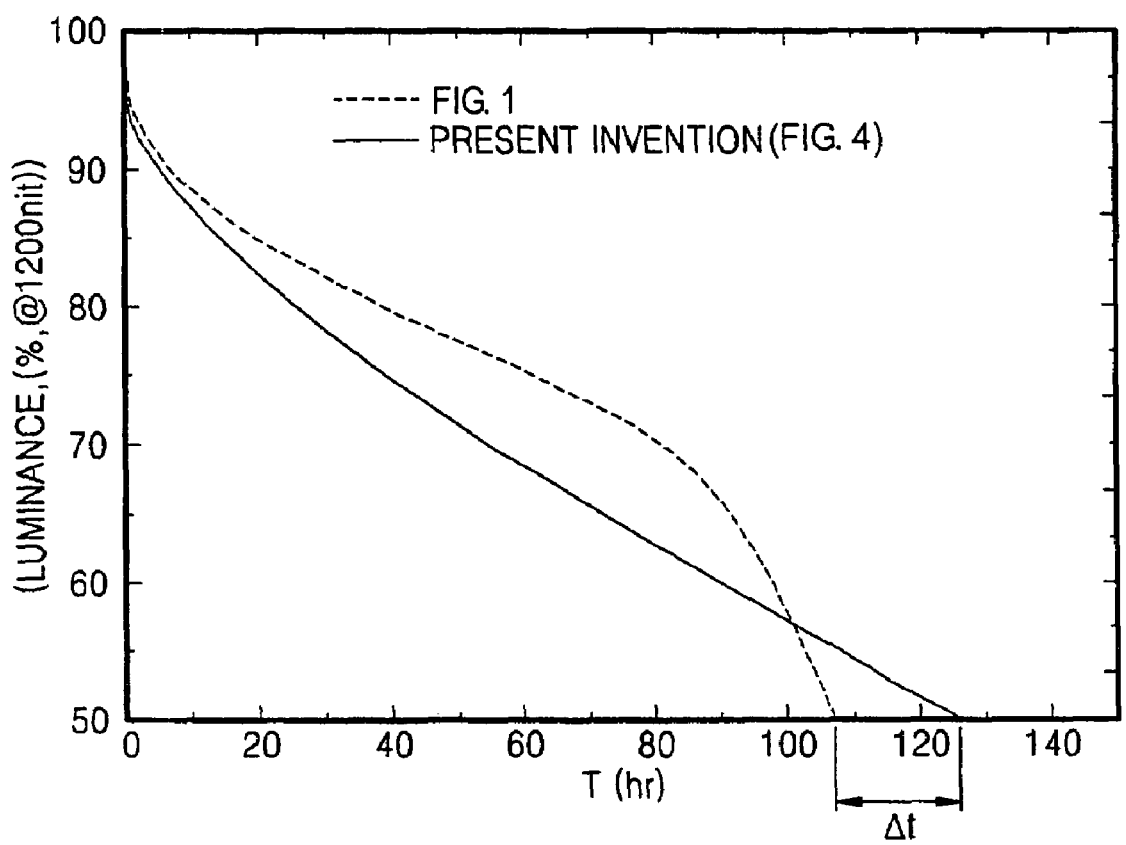
FIG. 6 is a graph of luminance versus time for both the organic light emitting diodes of FIGS. 1 and 4.

Turning now to FIG. 6, FIG. 6 is a graph of luminance versus time for each of the organic light emitting diode 100 of FIG. 4 and the organic light emitting diode of FIG. 1. As shown in FIG. 6, there is no rapid reduction in luminance, such as a tail drop, for the organic light emitting diode 100 of FIG. 4. This is because two separate light emission areas are successively used in the organic light emitting diode 100 of FIG. 4 for the initial and for the final usage stages. Accordingly, the lifespan of the organic light emitting diode 100 (the period of time until when the luminance is reduced to below 50% of the original value) increases by Δt over that of the organic light emitting diode of FIG. 1. Also according to FIG. 6, the luminance of the organic light emitting diode 100 of FIG. 4 is lower than that of the organic light emitting diode of FIG. 1 because not of all the light emitting part 120 is used for light emission at any one time. However, for the OLED 100 of FIG. 4, a sufficient luminance is still obtained for each of the initial and the final usage stages despite the fact that the regions corresponding to the straight and curved paths of FIGS. 5A and 5B respectively are used at different periods of time as described above. However, in the final usage stage, the luminance of the organic light emitting diode 100 of FIG. 4 is higher than that of the organic light emitting diode of FIG. 1. Therefore, overall, the organic light emitting diode 100 of FIG. 4 has sufficient light emission and increased lifespan.

Figure 7:
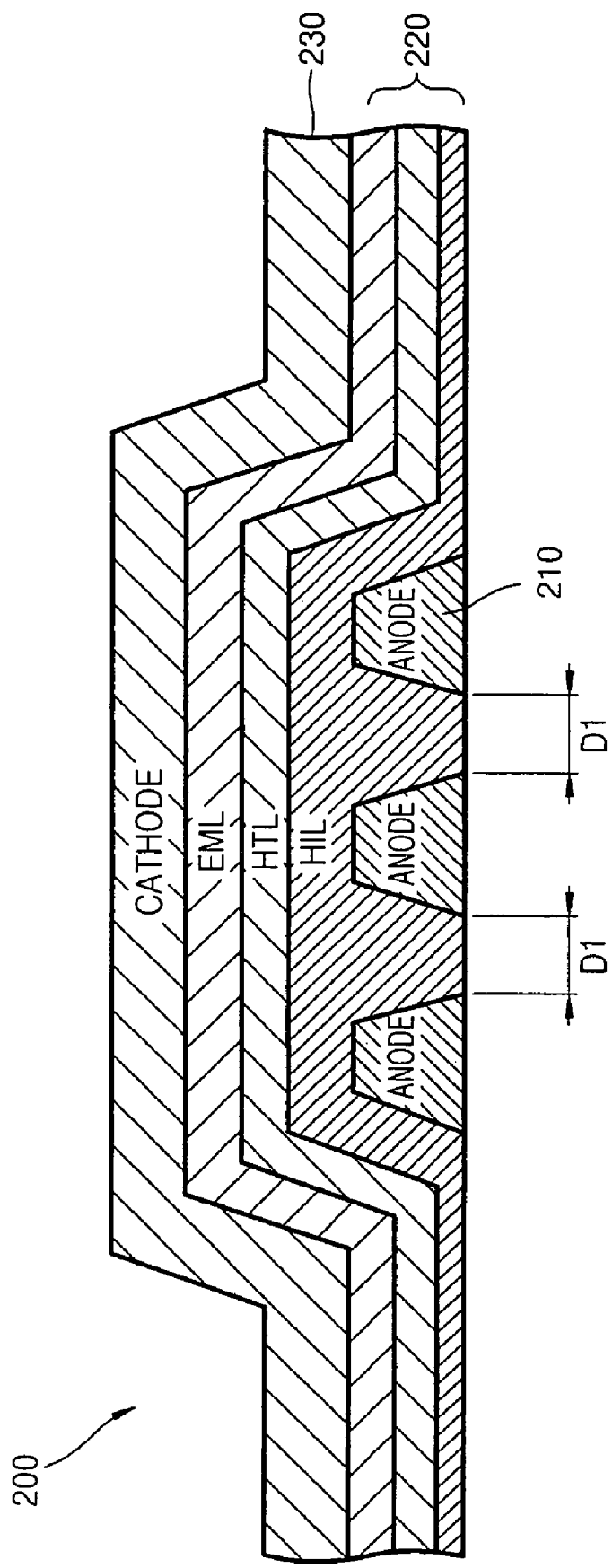
FIG. 7 is a cross sectional view of an organic light emitting diode according to a second embodiment of the present invention.

Turning now to FIG. 7, FIG. 7 is a cross-sectional view of an organic light emitting diode 200 according to a second embodiment of the present invention. The organic light emitting diode 200 of FIG. 7 includes a cathode 230 having a continuous structure, and an anode 210 formed in a striped pattern with a prong separation distance D1. Even though separate light emitting passages for the initial and for the final usage stages are provided at the anode 210 instead of at the cathode 230, the light emission of OLED 200 of FIG. 7 is substantially equal to that of the OLED 100 of FIG. 4. In other words, an electric coupling occurs along a straight path directed to anode 210 during the initial usage stage, and along a curved path avoiding the deteriorated region during the final usage stage so that sufficient luminance can be achieved at each usage stage while increasing the lifespan of the diode.

Figure 8:
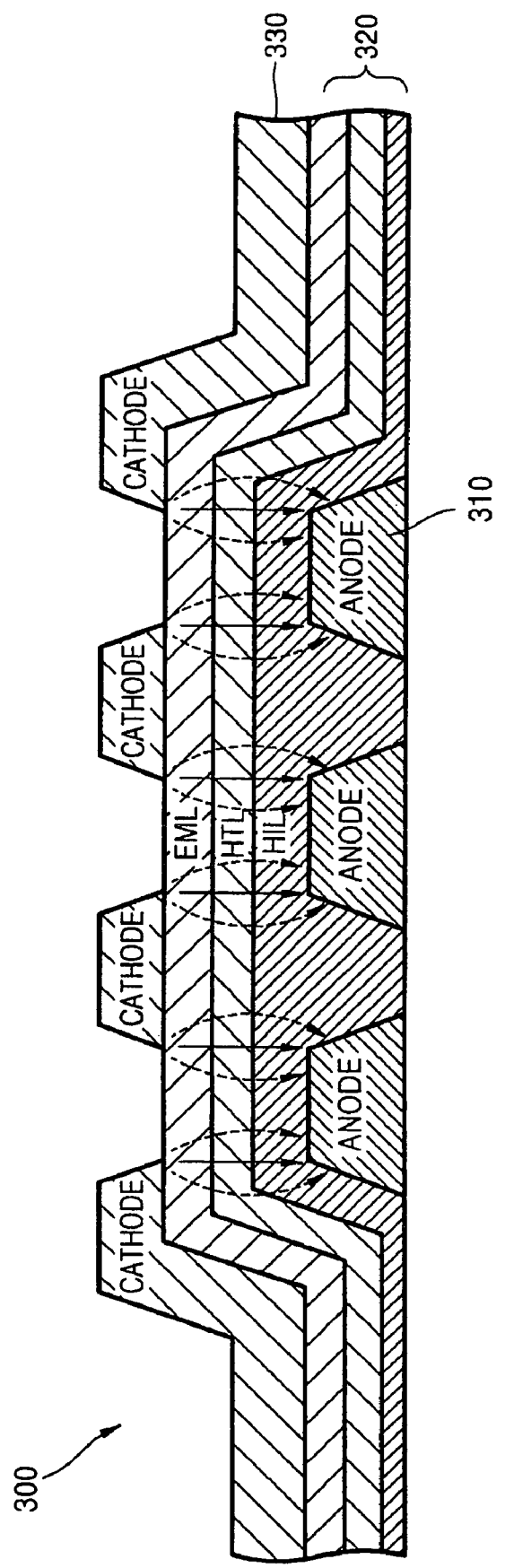
FIG. 8 is a cross sectional view of an organic light emitting diode according to a third embodiment of the present invention.

Turning now to FIG. 8, FIG. 8 is a cross-sectional view of an organic light emitting diode 300 according to a third embodiment of the present invention. In the organic light emitting diode 300 of FIG. 8, both the anode 310 and the cathode 330 are formed in a striped pattern so that the prongs of the anode 310 partially overlap the prongs of the cathode 330. Accordingly, electric coupling can take place along a straight line during the initial usage stage and along a curved line during the final usage stage. Thus, different light emitting areas are used for each of the initial and the final usage stages and the lifespan of the diode can be increased.

Figure 9:
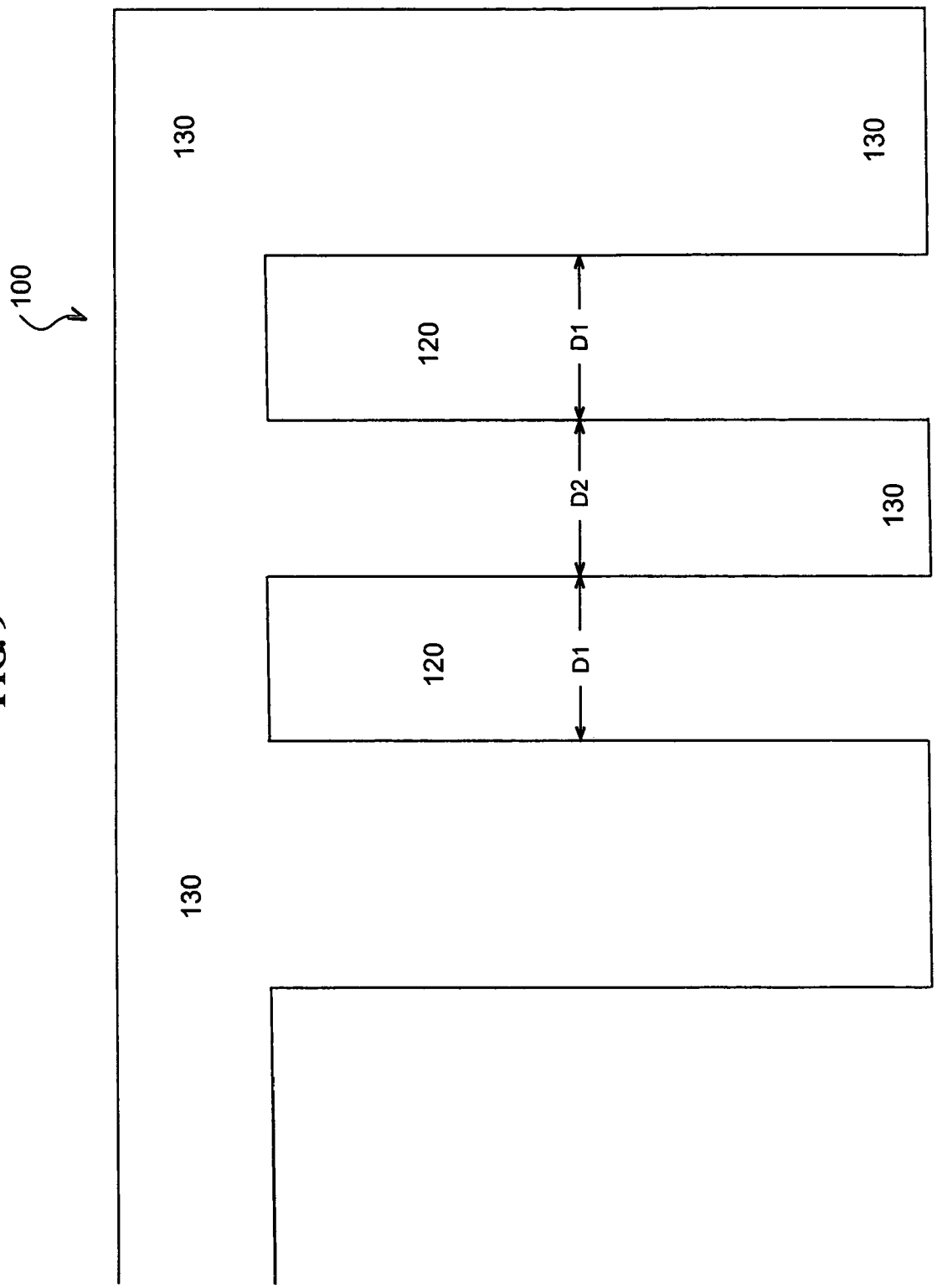
FIG. 9 is a top view of the organic light emitting diode of FIG. 4 showing the cathode in two dimensions.

Turning now to FIG. 9, FIG. 9 is a top view of the OLED 100 of FIG. 4 shows a top view of pronged cathode 130. As seen in FIG. 9, one possible two dimensional configuration of the cathode layer 130 is depicted, where prongs are separated from each other by a distance D1 and the middle prong has a width of D2. Alternatively, there can be many more prongs than that depicted in FIG. 9 for cathode 130. Further, the design of FIG. 9 or a similar one can be applied to the anode 210 of FIG. 7 and to the anode 310 and the cathode 330 of FIG. 8.

The organic light emitting diodes of the present invention use separate light emission areas of the light emitting part for each of the initial and final usage stages so that a rapid luminance drop (i.e., a tail drop) can be prevented, leading to increased lifespan of the diode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting diode, comprising:
   an anode;
   a light emitting part arranged on the anode; and
   a cathode arranged on the light emitting part, wherein at least one of the anode and the cathode is arranged as a striped pattern comprising a plurality of stripes, each stripe separated from an adjoining stripe by a pattern distance, the organic light emitting diode being of a laminated structure, the plurality of stripes being within said organic light emitting diode, wherein each of the cathode and the anode have a striped pattern that comprises a plurality of stripes, wherein ones of the plurality of stripes of the cathode extend in a direction that is parallel to ones of the plurality of stripes of the anode.

2. The organic light emitting diode of claim 1, wherein the pattern distance is equal to a width of a stripe arranged at a center of the striped pattern.

3. The organic light emitting diode of claim 2, wherein the pattern distance is in the range of 10 μm to 1000 μm.

4. The organic light emitting diode of claim 1, wherein an another of the anode and the cathode is also arranged in a striped pattern that comprises a plurality of stripes, ones of the plurality of stripes of the anode being separated from each other by a pattern distance, and ones of the plurality of stripes of the cathode being separated from each other by the pattern distance, wherein each stripe of the anode partially overlaps a corresponding stripe of the cathode.

5. The organic light emitting diode of claim 1, wherein the light emitting part comprises:
   a hole injecting layer arranged on the anode;
   a hole transporting layer arranged on the hole injecting layer; and
   a light emitting layer arranged on the hole transporting layer.

6. The organic light emitting diode of claim 5, the light emitting layer comprises a polymeric material.

7. The organic light emitting diode of claim 5, the light emitting layer comprises a polymeric material dissolved in a solvent, wherein the polymeric material coalesces and precipitates out of the solvent upon application of a current thereto for an extended period of time.

8. The organic light emitting display of claim 1, wherein the light emitting part comprises a polymeric material dissolved in a solvent, the polymeric material to precipitate out of the solvent during a lifetime of the organic light emitting diode.

9. An organic light emitting display comprising a plurality of light emitting diodes, each of said plurality of light emitting diodes comprising:
   an anode;
   a light emitting layer arranged on the anode; and
   a cathode arranged on the light emitting layer, wherein at least one of the anode and the cathode is arranged as a striped pattern comprising a plurality of stripes, each stripe separated from an adjoining stripe by a pattern distance, each of said organic light emitting diodes being of a laminated structure, wherein each of the cathode and the anode have a striped pattern that comprises a plurality of stripes, wherein ones of the plurality of stripes of the cathode extend in a direction that is parallel to ones of the plurality of stripes of the anode.

10. The organic light emitting display of claim 9, wherein ones of the stripes of the anode partially overlaps ones of the stripes of the cathode.

11. The organic light emitting display of claim 9, wherein the light emitting layer comprises a polymeric material.

\* \* \* \* \*